(12) United States Patent
Nakanishi et al.

(10) Patent No.: US 9,842,738 B2
(45) Date of Patent: Dec. 12, 2017

(54) METHOD FOR MANUFACTURING SILICON CARBIDE SEMICONDUCTOR DEVICE AND SILICON CARBIDE SEMICONDUCTOR DEVICE

(71) Applicant: MITSUBISHI ELECTRIC CORPORATION, Chiyoda-ku (JP)

(72) Inventors: Yosuke Nakanishi, Tokyo (JP); Hiroaki Okabe, Tokyo (JP); Motoru Yoshida, Tokyo (JP); Kazuyuki Sugahara, Tokyo (JP); Takaaki Tominaga, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 15/302,287

(22) PCT Filed: Apr. 9, 2014

(86) PCT No.: PCT/JP2014/002053
§ 371 (c)(1),
(2) Date: Oct. 6, 2016

(87) PCT Pub. No.: WO2015/155806
PCT Pub. Date: Oct. 15, 2015

(65) Prior Publication Data
US 2017/0032968 A1 Feb. 2, 2017

(51) Int. Cl.
*H01L 29/16* (2006.01)
*H01L 29/47* (2006.01)
(Continued)

(52) U.S. Cl.
CPC ...... *H01L 21/268* (2013.01); *H01L 21/02529* (2013.01); *H01L 21/0485* (2013.01);
(Continued)

(58) Field of Classification Search
CPC . H01L 29/1608; H01L 29/475; H01L 29/872; H01L 29/66143; H01L 21/268; H01L 21/0485; H01L 21/02529
(Continued)

(56) References Cited

U.S. PATENT DOCUMENTS 5,124,780 A 6/1992 Sandhu et al.
7,052,943 B2 5/2006 Yamazaki et al.
(Continued)

FOREIGN PATENT DOCUMENTS

JP 64-057714 3/1989
JP 05-206061 8/1993
(Continued)

OTHER PUBLICATIONS

International Search Report dated Jul. 15, 2014 in PCT/JP2014/002053 filed Apr. 9, 2014.
(Continued)

*Primary Examiner* — Dao H Nguyen
(74) *Attorney, Agent, or Firm* — Oblon, McClelland, Maier & Neustadt, L.L.P.

(57) ABSTRACT

A method of manufacturing a silicon carbide semiconductor device is provided. The method suppresses the increase in the number of manufacturing steps and is capable of suppressing the degradation of ohmic characteristics of an alloy layer with respect to a semiconductor substrate. The method includes a step of forming a metal layer made of a first metal on a semiconductor substrate made of silicon carbide; a step of forming a metal nitride film obtained by nitriding a second metal on the metal layer; a step of directing a laser light through the metal nitride film to form a layer of an alloy of silicon carbide in the semiconductor substrate and the first metal in the metal layer; and a step of forming an electrode on the metal nitride film.

18 Claims, 7 Drawing Sheets

(51) Int. Cl.
- *H01L 21/268* (2006.01)
- *H01L 21/28* (2006.01)
- *H01L 21/02* (2006.01)
- *H01L 29/66* (2006.01)
- *H01L 29/872* (2006.01)
- *H01L 21/04* (2006.01)

(52) U.S. Cl.
CPC ...... *H01L 29/475* (2013.01); *H01L 29/66143* (2013.01); *H01L 29/872* (2013.01); *H01L 29/1608* (2013.01)

(58) Field of Classification Search
USPC .......... 257/77, 744, 759, E29.068, E29.104, 257/E29.143, E21.025, E21.061, E21.062, 257/E21.158, E21.159; 438/105, 136, 438/523, 570, 602, 663
See application file for complete search history.

(56) References Cited

U.S. PATENT DOCUMENTS

| | | | |
|---|---|---|---|
| 7,833,866 B2 | 11/2010 | Shima | |
| 8,216,929 B2 | 7/2012 | Kawai et al. | |
| 8,237,172 B2 * | 8/2012 | Uchida | H01L 21/0485 257/288 |
| 8,440,524 B2 | 5/2013 | Fujiwara et al. | |
| 8,679,973 B2 | 3/2014 | Akiyama et al. | |
| 9,768,260 B2 * | 9/2017 | Kinoshita | H01L 29/1608 |
| 2002/0068488 A1 * | 6/2002 | Tuller | H01L 21/048 439/775 |
| 2005/0104072 A1 | 5/2005 | Slater, Jr. et al. | |
| 2006/0273323 A1 * | 12/2006 | Yamamoto | H01L 21/0485 257/77 |
| 2008/0296771 A1 * | 12/2008 | Das | H01L 21/0475 257/758 |
| 2011/0207321 A1 * | 8/2011 | Fujiwara | C22F 1/10 438/663 |
| 2012/0164765 A1 | 6/2012 | Slater, Jr. et al. | |
| 2012/0171864 A1 | 7/2012 | Akiyama et al. | |
| 2013/0288467 A1 * | 10/2013 | Ebiike | H01L 29/0619 438/523 |
| 2015/0001554 A1 * | 1/2015 | Imai | H01L 29/47 257/77 |
| 2015/0129896 A1 * | 5/2015 | Kawakami | H01L 29/47 257/77 |
| 2016/0056041 A1 * | 2/2016 | Tamaso | H01L 21/0475 438/602 |

FOREIGN PATENT DOCUMENTS

| | | |
|---|---|---|
| JP | 2003-173967 A | 6/2003 |
| JP | 2007-534143 | 11/2007 |
| JP | 2008-153442 A | 7/2008 |
| JP | 2011-91100 A | 5/2011 |
| JP | 2011-171551 A | 9/2011 |
| JP | 2012-69798 A | 4/2012 |
| JP | 2012-156390 | 8/2012 |
| JP | 2012-253374 A | 12/2012 |
| JP | 2013-105881 A | 5/2013 |
| WO | 2005/020308 A1 | 3/2005 |

OTHER PUBLICATIONS

International Preliminary Report on Patentability and Written Opinion dated Oct. 12, 2016 in PCT/JP2014/002053 (with English translation).

* cited by examiner

F I G. 1
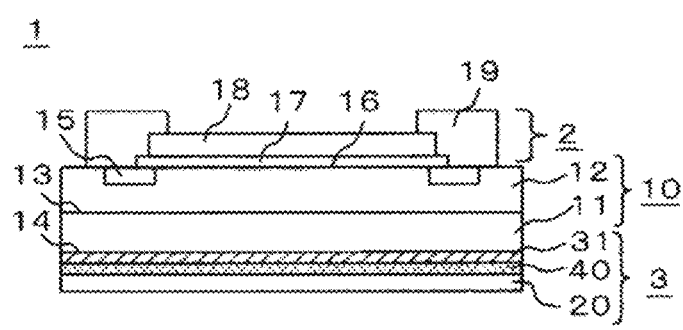

F I G. 3
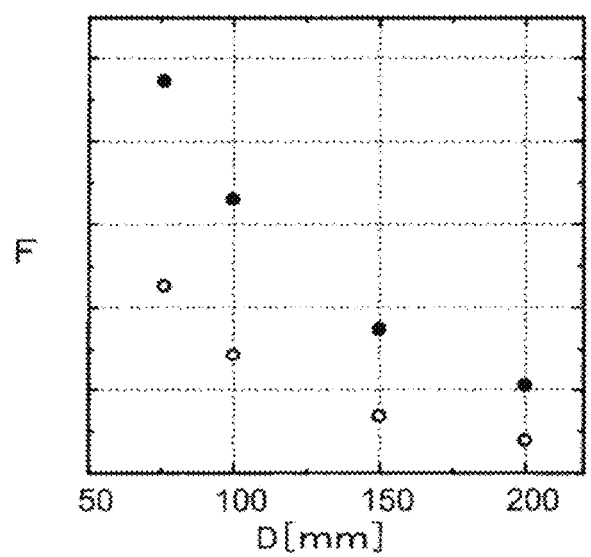
F I G. 4
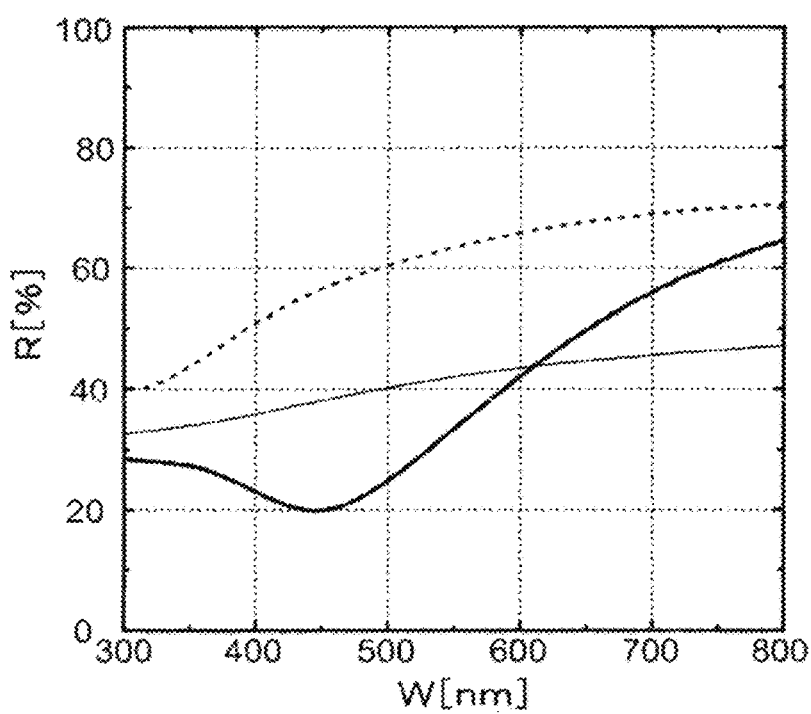

F I G. 5
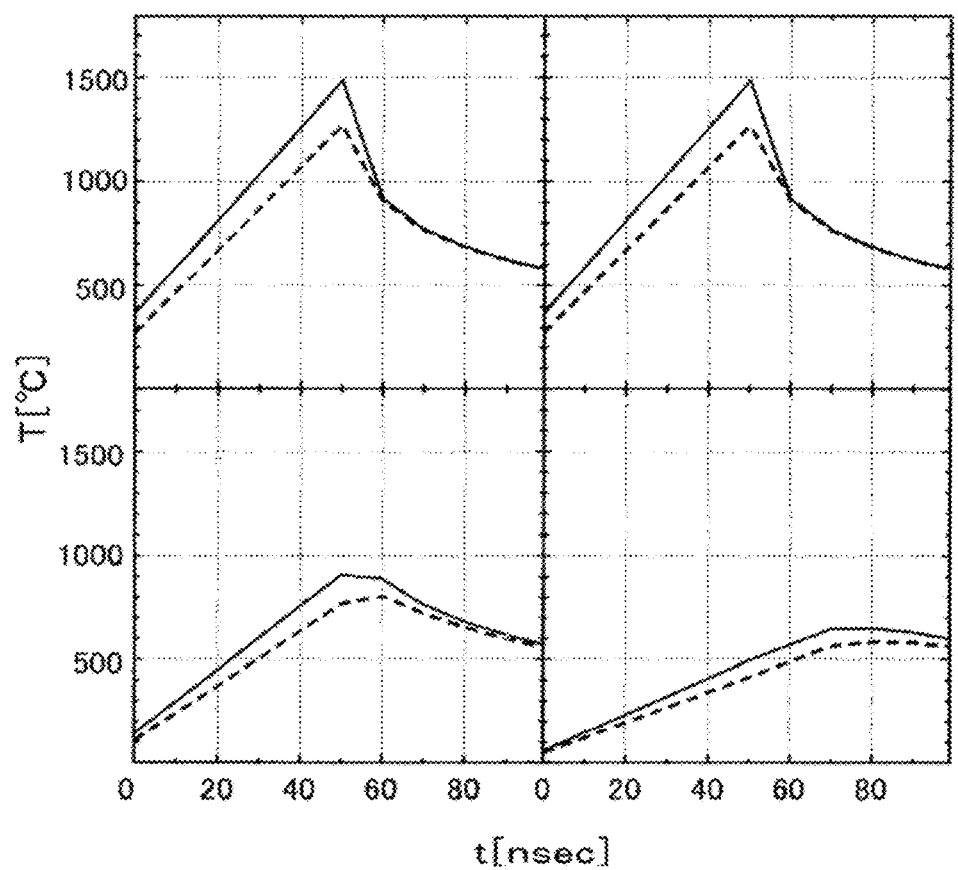

(a)

(b)

F I G. 1 1
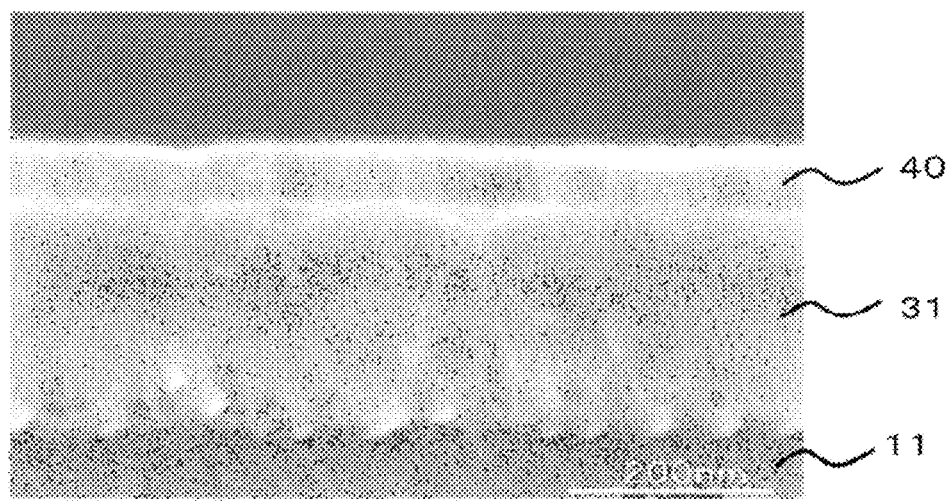

US 9,842,738 B2

METHOD FOR MANUFACTURING SILICON CARBIDE SEMICONDUCTOR DEVICE AND SILICON CARBIDE SEMICONDUCTOR DEVICE

TECHNICAL FIELD

The present invention relates to a method of manufacturing a silicon carbide semiconductor device, and a silicon carbide semiconductor device.

BACKGROUND ART

In a silicon carbide semiconductor device in which carriers travel in a vertical direction through a silicon carbide substrate when in operation, a device resistance is decreased by reducing the thickness of the substrate. For further decrease in resistance, there has been a need for a silicon carbide semiconductor device manufactured using a substrate in the form of a thin plate.

In a method of manufacturing a silicon carbide semiconductor device which includes the step of providing a substrate in the form of a thin plate, it is desirable that a back surface structure of the semiconductor device is formed after a front surface structure thereof is formed and that the substrate is thinned during the formation of the back surface structure for the purpose of reducing the number of steps for the thin substrate. For this reason, the back surface structure is formed after the front surface structure is formed. In the step of forming the back surface structure of the silicon carbide semiconductor device, it is however necessary that annealing is performed on only the back surface of the silicon carbide semiconductor device at a high temperature of approximately 1000° C. to form an ohmic electrode, with the from surface thereof maintained at a low temperature.

A method of forming an ohmic electrode on a silicon carbide semiconductor substrate by means of laser annealing is disclosed, for example, in Patent Literature 1. In such a manufacturing method, a metal layer is deposited on a semiconductor substrate made of silicon carbide, and is thereafter irradiated with laser light, so that the metal layer is heated. This forms a layer of an alloy of the metal layer and the semiconductor substrate at an interface therebetween. The alloy layer formed in this manner has excellent ohmic properties with respect to the semiconductor substrate, and is therefore expected to be used as the ohmic electrode.

Unfortunately, when oxygen is present in a laser light irradiation atmosphere, the metal layer is oxidized during the irradiation with the laser light, so that a good alloy layer cannot be formed. As a result, ohmic characteristics of the alloy layer with respect to the semiconductor substrate are degraded. To solve such a problem, a manufacturing method has been proposed in which a permeable film of $SiO_2$, $CaF_2$, ITO and the like is deposited on the metal layer formed on the semiconductor substrate, and in which electromagnetic waves such as laser are directed through the permeable film onto the metal layer to heat the metal layer, thereby forming the alloy layer (for example, Patent Literature 2). In this manner, the laser annealing through the permeable film suppresses the oxidation of the metal film due to ambient oxygen during the irradiation with the laser light.

CITATION LIST

Patent Literature

Patent Literature 1: Japanese Unexamined Patent Application Publication (Translation of PCT Application) No. 2007-534143

Patent Literature 2: Japanese Patent Application Laid-Open No. 2012-069798

SUMMARY OF INVENTION

Technical Problem

In such a method of manufacturing a silicon carbide semiconductor device, it is necessary that the step of removing the permeable film must be provided in addition to the step of depositing the permeable film. In particular, when the permeable film is not electrically conductive, it is essential to remove the permeable film. This gives rise to a problem such that the number of manufacturing steps is increased. When an oxide is used for the permeable film, there is still a danger that the metal layer is oxidized because of the influence of interdiffusion in the case where the permeable film reaches a high temperature during the laser irradiation. This causes the problem of the degradation of the ohmic characteristics of the alloy layer with respect to the semiconductor substrate.

The present invention has been made to solve the aforementioned problems. It is therefore an object of the present invention to provide a method of manufacturing a silicon carbide semiconductor device which suppresses the increase in the number of manufacturing steps and which is capable of suppressing the degradation of ohmic characteristics of an alloy layer with respect to a semiconductor substrate.

Solution to Problem

A method of manufacturing a silicon carbide semiconductor device according to the present invention includes the steps of: forming a metal layer made of a first metal on a semiconductor substrate made of silicon carbide; forming a metal nitride film on the metal layer, the metal nitride film being obtained by nitriding a second metal; directing laser light through the metal nitride film to form it layer of an alloy of silicon carbide in the semiconductor substrate and the first metal in the metal layer; and forming an electrode on the metal nitride film.

Advantageous Effects of Invention

According to the method of manufacturing a silicon carbide semiconductor device according to the present invention, the use of an electrically conductive metal nitride film as a permeable film eliminates the need to provide the step of removing the permeable film during the formation of a back surface structure of the silicon carbide semiconductor device. This suppresses the increase in the number of manufacturing steps. Also, the metal nitride film contains no oxygen atoms. This reduces the danger that the metal layer is oxidized during the laser irradiation to suppress the degradation of ohmic characteristics of the alloy layer with respect to the semiconductor substrate.

BRIEF DESCRIPTION OF DRAWINGS

FIG. 1 is a schematic sectional view showing a silicon carbide semiconductor device according to a first embodiment of the present invention.

FIG. 3 is a graph showing a treatment speed in an annealing treatment step in the method of manufacturing a silicon carbide semiconductor device.

FIG. 4 is a graph showing experimental results obtained by measuring a surface reflectivity for laser light having a plurality of wavelengths.

FIG. 5 is a graph showing calculation results about changes in interface temperature due to thermal diffusion when the thickness of a permeable film is changed.

FIG. 11 shows a sectional SEM image of the silicon carbide semiconductor device according to the second embodiment of the present invention.

DESCRIPTION OF EMBODIMENTS

First Embodiment

Figure 2:
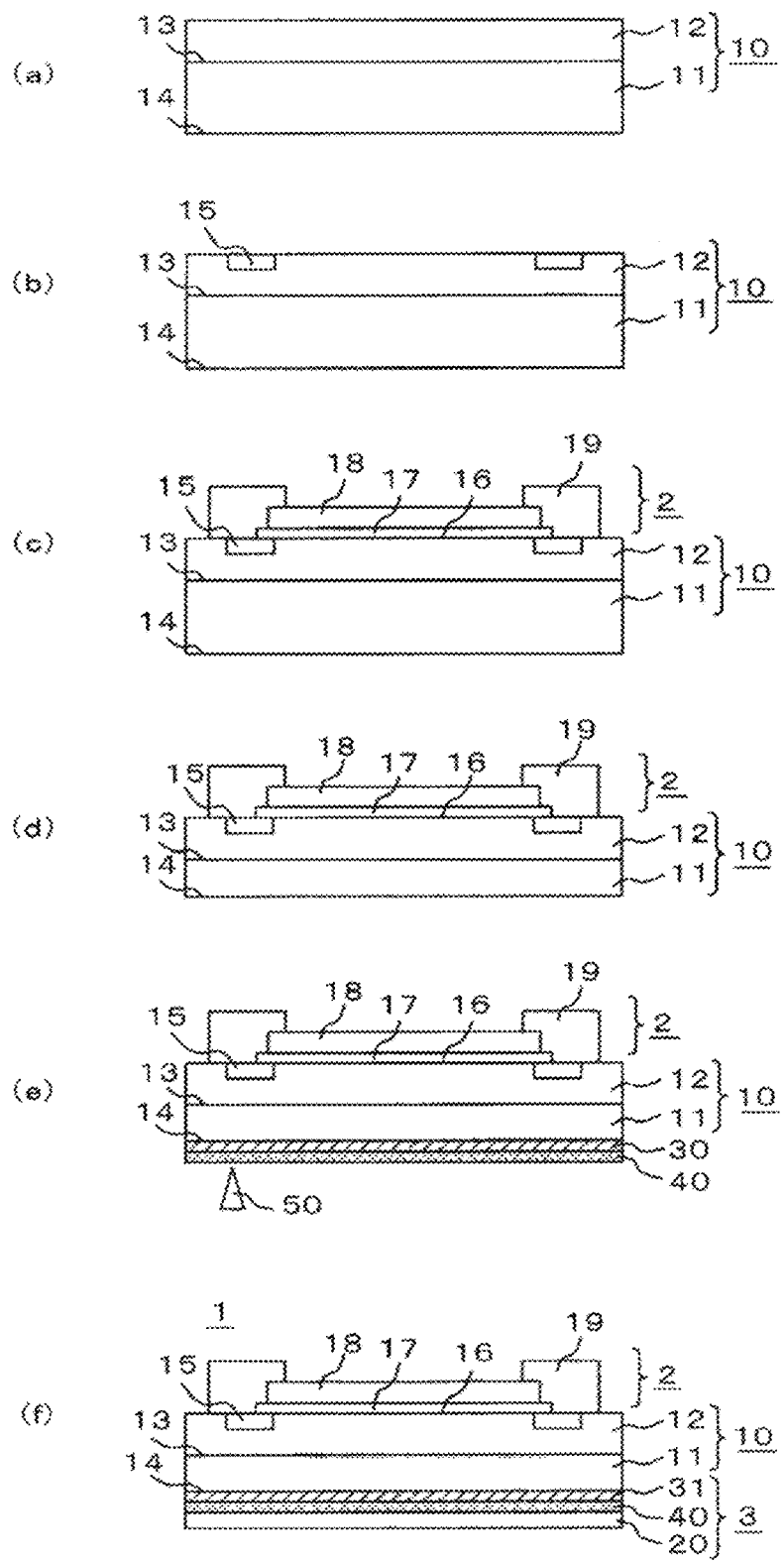
FIGS. 2A to 2F are schematic sectional views showing manufacturing steps in a method of manufacturing a silicon carbide semiconductor device according to the first embodiment of the present invention.

First, the configuration of a silicon carbide semiconductor device according to a first embodiment of the present invention will be described. FIG. 1 is a schematic sectional view showing a silicon carbide semiconductor device 1 according to the first embodiment of the present invention. Although a Schottky barrier diode (referred to hereinafter as an "SBD") of a vertical type is taken as an example for description, the present invention is not limited to this. A semiconductor device such as a field effect transistor (MOSFET: Metal Oxide Semiconductor Field Effect Transistor) may be used. Also, silicon carbide is abbreviated as "SiC" hereinafter.

With reference to FIG. 1, the SiC semiconductor device 1 that is an SBD includes a SiC semiconductor base body 10, a front surface structure 2 and a back surface structure 3. The SiC semiconductor base body 10 shall refer to a combination of an $n^+$ type SiC semiconductor substrate 11 having a 4H polytype and including a first main surface 13 with a surface orientation 4° or 8° off the (0001) silicon surface, and an n type SiC drift layer 12 formed on the first main surface 13 of the SiC semiconductor substrate 11. The SiC drift layer 12 has a concentration and a thickness that are varied depending on a breakdown voltage to be used, and that are considered to be $5 \times 10^5$ cm$^{-3}$ and 10 µm, for example.

A p type ion implanted region 15 containing aluminum (Al) as p type impurities is formed in areas spaced a certain width apart from each other on the from surface side of the SiC drift layer 12. The ion implanted region 15 has the shape of a ring with a certain width, as seen in top plan view. An example of an Al ion implant dose is $5 \times 10^{17}$ cm$^{-3}$. In some cases, a ring-shaped JTE (Junction Termination Extension) region is provided outside the ion implanted region 15 to ensure the breakdown voltage of the SiC semiconductor device 1. The JTE region is not shown in FIG. 1.

The front surface structure 2 is provided on the first main surface 13 side, i.e. the front surface side, of the SiC semiconductor substrate 11. The front surface structure 2 includes a Schottky electrode 17, an interconnect electrode 18 and a protective film 19. The Schottky electrode 17 is formed on a Schottky region 16 on the front surface side of the SiC drift layer 12 surrounded by the ion implanted region 15. The periphery of the Schottky electrode 17 is formed so as to extend onto the ion implanted region 15. An example of the material used for the Schottky electrode 17 includes Ti. The interconnect electrode 18 is formed on the upper surface of the Schottky electrode 17. An example of the material used for the interconnect electrode 18 includes Al. For the purpose of ensuring the breakdown voltage of the SiC semiconductor device 1, the protective film 19 made of, for example, polyimide is formed on the SiC drift layer 12 so as to cover the Schottky electrode 17, the ends of the interconnect electrode 18, and the ion implanted region 15.

The back surface structure 3 is provided on a second main surface 14 side, i.e. the back surface side, of the SiC semiconductor substrate 11. The back surface structure 3 includes an alloy layer 31, a permeable film 40 and a back surface electrode 20. The alloy layer 31 is made of an alloy of SiC and a metal containing any one element selected from the group consisting of Ni, Ti, Mo, W and Ta, and has excellent ohmic characteristics with respect to the SiC semiconductor substrate 11. That is, this alloy layer 31 is formed as an ohmic electrode. In the present embodiment, the alloy layer 31 shall be made of an alloy of Ni and SiC. Further, the permeable film 40 that is electrically conductive is formed on a surface of the alloy layer 31 which is opposite to the SiC semiconductor base body 10. An example of the material of the permeable film 40 includes a metal nitride film such as TiN, and the metal nitride film is electrically conductive. The back surface electrode 20 is formed on a surface of the permeable film 40 which is opposite to the alloy layer 31. Examples of the back surface electrode 20 include an electrode having a two-layer structure comprised of Ni and Au, and a Cu electrode. The back surface electrode 20 in the present embodiment shall be an electrode having a two-layer structure comprised of Ni and Au.

Next, a method of manufacturing the SiC semiconductor device 1 according to the first embodiment of the present invention will be described. FIGS. 2A to 2F are schematic sectional views showing manufacturing steps in the method of manufacturing the SiC semiconductor device 1 according to the first embodiment of the present invention.

In the step shown in FIG. 2A, the SiC drift layer 12 is epitaxially grown on the first main surface 13 of the $n^+$ type SiC semiconductor substrate 11. Thus, the SiC semiconductor base body 10 is formed.

In the step shown in FIG. 2B, after a mask made of an oxide film and the like is formed on the SiC drift layer 12, a mask for ion implantation is formed by photolithography and etching. This mask is not shown in FIG. 2B. Selective Al ion implantation is performed from above the mask for ion implantation to form the ion implanted region 15. Next, the mask for ion implantation is removed. Thereafter, heat treatment is performed at 1700° C. for 30 minutes in an argon atmosphere for the purpose of activating the implanted Al ions. This heat treatment step forms the p type ion implanted region 15. After the heat treatment step, a film quality degraded layer and asperities caused by a bunching step with a height of not less than 30 nm are produced on the front surface of the SiC drift layer 12. Thus, hydrocarbon gas is thermally decomposed to form a carbon protective film not shown on the front surface of the SiC drift layer 12. This prevents step bunching from occurring in the heat treatment step.

In the step shown in FIG. 2C, the Schottky electrode 17 made of Ti, for example, is formed on the front surface of the SiC drift layer 12. Next, the interconnect electrode 18 made of Al, for example, is formed on the Schottky electrode 17. Further, the protective film 19 made of polyimide, for example, is formed to ensure the breakdown voltage. Before the formation of the Schottky electrode 17, the SiC semiconductor base body 10 may be subjected to a wet treatment using a sulfuric acid-hydrogen peroxide mixture, an ammonia-hydrogen peroxide mixture and hydrofluoric acid in the order named. Also, the front surface of the SiC drift layer 12 may be cleaned by a hydrofluoric acid treatment after sacrificial oxidation is performed thereon. The periphery of the Schottky electrode 17 is formed so as to extend onto the ion implanted region 15. The protective film 19 made of polyimide is formed so as to cover the Schottky electrode 17, the ends of the interconnect electrode 18, and the ion implanted region 15.

In the step shown in FIG. 2D, the second main surface 14 of the SiC semiconductor substrate 11 is mechanically ground and polished, so that the thickness of the SiC semiconductor base body 10 reaches a suitable thickness, for the purpose of improving the characteristics of the SBD (decreasing the resistance related to forward characteristics). For example, the grinding is performed until the thickness of the SiC semiconductor base body 10 reaches 200 µm. During the grinding, the first main surface 13 side where the device structure is formed is protected by affixing a protective tape thereto or by affixing the first main surface 13 side to a support plate.

In the step shown in FIG. 2E, a metal layer 30 for the formation of a suicide layer (alloy layer 31) with SiC is deposited on the second main surface 14 of the SiC semiconductor substrate 11 subjected to the grinding. Although Ni is used for the metal layer 30 in the present embodiment, a metal containing any one element selected from the group consisting of Ti, Mo, W and Ta may be used. The metal layer 30 may have a thickness of 100 nm, for example. Thereafter, the permeable film 40 is deposited on the metal layer 30.

The permeable film 40 is a metal nitride film, and shall be a TiN film in the present embodiment. A laser annealing treatment which directs laser light 50 through the permeable film 40 is performed to cause metal in the metal layer 30 and SiC in the SiC semiconductor substrate 11 to react with each other, thereby forming the alloy layer 31. Although the laser annealing treatment is performed so that all of the metal layer 30 is in principle silicided to form the alloy layer 31, part of the metal layer 30 may be left unreacted, depending on the thickness of the metal layer 30 and the like.

When a YAG laser is used as an example, the wavelength of the directed laser light 50 may be 355 nm corresponding to third harmonics or 532 nm corresponding to second harmonics. The annealing is performed while an inert gas such as nitrogen is blown on a surface irradiated with the laser light during the laser light irradiation. The laser light 50 having a wavelength of 355 nm shall be used herein. The permeable film 40 may have a thickness of 30 nm, for example, which will be described later in detail. The type of the laser light 50 used for the laser annealing may include an excimer laser, a YVO4 laser, a YLF laser and the like in addition to the YAG laser. It is only necessary that the condition for the laser used for the silicidation of the metal layer 30 deposited on the SiC semiconductor base body 10 is that the laser tight 50 is transmitted through the permeable film 40. For example. a laser of a pulse oscillation type of tens of nanoseconds at a wavelength of 355 nm may be used.

In the step shown in FIG. 2F, the back surface electrode 20 is formed on the permeable film 40 formed in the step shown in FIG. 2E. When there is a danger that an oxide film or the like is formed on the front surface of the permeable film 40 during the laser annealing treatment, etching may be performed using $Ar^+$ ions and the like before the formation of the back surface electrode 20. The material of the back surface electrode 20 shall be an electrode having a two-layer structure comprised of Ni and Au. A Cu electrode may be used as the back surface electrode 20 when a response to a higher temperature operation is required, for example.

The first embodiment according to the present invention having the aforementioned configuration produces effects to be described below.

In the present embodiment, the use of the electrically conductive metal nitride film as the permeable film 40 eliminates the need to provide the step of removing the permeable film 40 during the formation of the back surface structure 3 of the SiC semiconductor device 1, and allows the formation of the back surface electrode 20 on the permeable film 40. This suppresses the increase in the number of manufacturing steps during the formation of the back surface structure 3. Also, the metal nitride film used as the permeable film 40 contains no oxygen atoms. This reduces the danger that the metal layer 30 is oxidized during the laser irradiation for the formation of the alloy layer 31 to suppress the degradation of the ohmic characteristics of the alloy layer 31 with respect to the SiC semiconductor substrate 11.

In the method of manufacturing a silicon carbide semiconductor device, a treatment at a high temperature on the order of 1000° C. is required to form the alloy layer 31 of metal such as Ni and SiC during the formation of the ohmic electrode. For this reason, the method of manufacturing a silicon carbide semiconductor device has a problem such that the amount of time required for the heat treatment step during the formation of the ohmic electrode is increased as compared with a method of manufacturing other semiconductor devices made of Si and the like. The time required for the laser annealing treatment of a single SiC semiconductor substrate is dependent on an area to be irradiated and a beam diameter. FIG. 3 shows a treatment speed F (ordinate) in the laser annealing treatment versus a substrate diameter D (abscissa). In FIG. 3, solid circles (●) denote values for large beam diameters, and open circles (○) denote values for small beam diameters. It is found that the greater the substrate diameter is (the greater the irradiated area is) or the smaller the beam diameter is, the slower the treatment speed F is. It is therefore a challenge to improve the treatment speed in the laser annealing treatment as the diameter of the SiC semiconductor substrate increases and the irradiated area increases in the future.

For the improvement in the treatment speed in the laser annealing treatment, it is necessary to increase the beam diameter without decreasing the energy density of the laser light. However, when the laser light having a wavelength of 355 nm is used, the shaping of the beam is difficult, and it is accordingly difficult to increase the beam diameter without decreasing the energy density. In the present embodiment, the laser light is directed through the permeable film 40 during the laser annealing treatment. This reduces the amount of reflected laser light because the surface reflectivity of the permeable film 40 is lower than the surface reflectivity of the metal layer 30. In other words, the amount of laser light absorbed by the metal layer 30 side is increased. As a result, the heat energy absorbed by the metal layer 30 side is increased without increasing the beam diameter of the laser light. This achieves the improvement in the treatment speed in the laser annealing treatment.

FIG. 4 is a graph showing experimental results obtained by measuring a surface reflectivity R when the front surface of Ni (film thickness of 100 nm) alone and the front surface of TaN (film thickness of 50 nm) or TiN (50 nm) formed on Ni (film thickness of 100 nm) are irradiated with the laser light having a plurality of wavelengths. In FIG. 4, the abscissa represents a wavelength W, and the ordinate represents the surface reflectivity R. The broken line denotes the experimental results for Ni (film thickness of 100 nm) alone; the thin solid line denotes the experimental results for TaN (film thickness of 50 nm)/Ni; and the thick solid line denotes the experimental results for TiN (50 nm)/Ni. The measurements were made using a UV-visible/near infrared spectrophotometer (model name of V670) available from JASCO Corporation.

As shown in FIG. 4, it is found that the provision of the permeable film 40 that is a metal nitride film such as TiN decreases the surface reflectivity at the plurality of wavelengths of the laser light, as compared with the case in which only Ni is provided, i.e., the permeable film 40 is not provided. Thus, the amount of laser light absorbed by the metal layer 30 side is increased. This achieves the improvement in the treatment speed in the laser annealing treatment without increasing the beam diameter of the laser light.

FIG. 5 is a graph showing calculation results about changes in temperature of an interface between the permeable film 40 and the metal layer 30 and in temperature of an interface between the semiconductor substrate 11 and the metal layer 30 due to thermal diffusion when the thickness of the permeable film 40 is changed. In FIG. 5, the abscissa represents time t [nsec], and the ordinate represents temperature T [° C.]. The upper left part of the graph shows the interface temperature in the case where the permeable film 40 is not provided; the upper right part of the graph shows the interface temperature in the case where the permeable film 40 has a thickness of 50 nm; the lower left part of the graph shows the interface temperature in the case where the permeable film 40 has a thickness of 500 nm; and the lower right part of the graph shows the interface temperature in the case where the permeable film 40 has a thickness of 1000 nm. In each part of the graph, the solid lines denote changes in temperature of the interface between the permeable film 40 made of TiN and the metal layer 30 made of Ni, and the broken lines denote changes in temperature of the interface between the metal layer 30 made of Ni and the semiconductor substrate 11 made of SiC. The metal layer 30 shall have a thickness of 100 nm. The energy density of the laser light 50 is made higher by a predetermined amount in consideration for the large surface reflection of the laser light 50 only in the case where the permeable film 40 is not provided.

As mentioned above, the provision of the permeable film 40 achieves the improvement in the treatment speed in the laser annealing treatment. However, if the permeable film 40 is too thick, the laser light 50 does not reach the interface between the permeable film 40 and the metal layer 30 but is absorbed by the permeable film 40. For silicidation of the metal layer 30 under the permeable film 40 by reaction with SiC in the semiconductor substrate 11 in such a case, there arises a need for the beat generated in the permeable film 40 by absorbing the laser light 50 to reach the metal layer 30 due to thermal diffusion, thereby increasing the temperature of the metal layer 30 up to 1000° C.

As shown in FIG. 5, it is found that the temperature of each of the interfaces does not reach 1000° C. when the thickness of the permeable film 40 is not less than 500 nm. It is found, on the other hand, that the temperature of each of the interfaces reaches 1000° C. and sufficient thermal diffusion occurs when the thickness of the permeable film 40 is equal to 50 nm. Thus, when the thickness of the permeable film 40 is not less than 500 nm, the silicidation of the metal layer 30 does not sufficiently proceeds because of insufficient thermal diffusion, so that it is difficult to improve the treatment speed in the annealing treatment. It is hence desirable that the thickness of the permeable film 40 is not greater than 500 nm.

Figure 6:
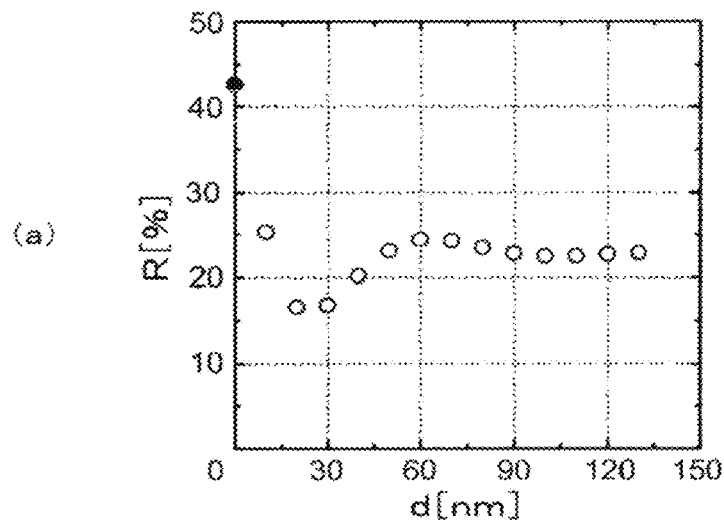
FIGS. 6A and 6B are graphs showing a relationship between the surface reflectivity and the thickness of the permeable film of the silicon carbide semiconductor device according to the first embodiment of the present invention.
Figure 6:
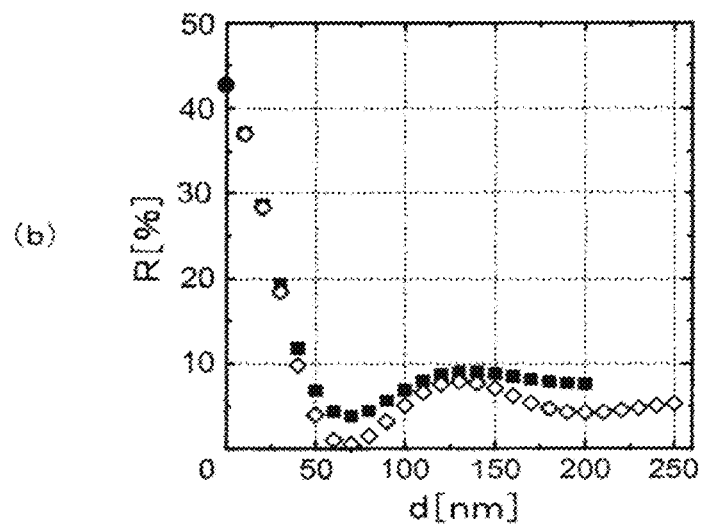
Figure 7:
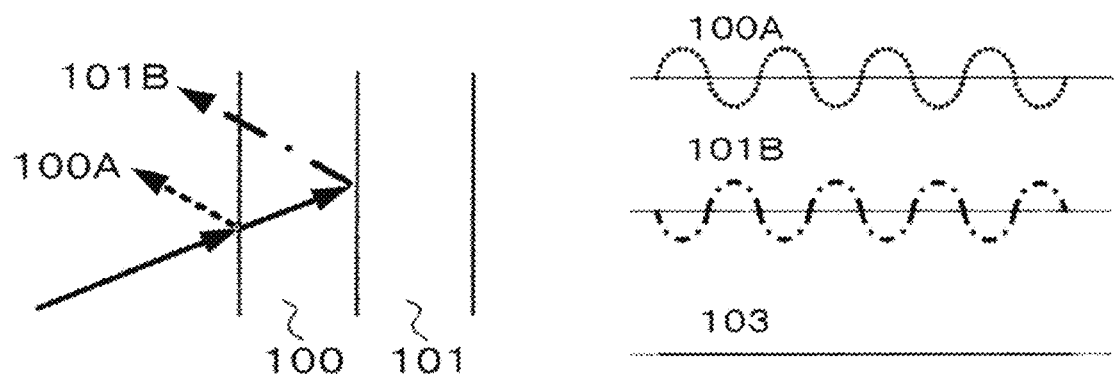
FIG. 7 is a schematic view showing the effect of anti-reflection according to the first embodiment of the present invention.

FIG. 6A is a graph showing results of calculation about a relationship between the surface reflectivity R (ordinate) of the permeable film 40 (TiN film) formed on the metal layer 30 (Ni layer) and the thickness d (abscissa) thereof during the irradiation with light having a wavelength of 355 nm, the calculation being made using Fresnel equations. In FIG. 6A, the surface reflectivity R obtained when the thickness d of the permeable film 40 is equal to 0 indicates the surface reflectivity R of the Ni layer itself on which the permeable film 40 is not formed (the same applies to FIG. 6B). FIG. 7 is a schematic view showing the anti-reflection effect of the permeable film 40 having a predetermined thickness.

As mentioned above, when the thickness of the permeable film 40 is greater than 0 nm and not greater than 500 nm, the surface reflectivity of the permeable film 40 is lower than that of the Ni layer itself. This achieves the improvement in the treatment speed in the laser annealing treatment. It is however desirable that the thickness of the permeable film 40 is in particular in the range of 20 to 30 nm for reasons to be described below.

As shown in FIG. 6A, the surface reflectivity decreases as the thickness of the TiN film increases. It is found, in particular, that the surface reflectivity is significantly decreased when the thickness of the TiN film is in the range of 20 to 30 nm. This is because the amplitudes of the wave fronts reflected from the front surface of the TiN film and the TiN/Ni interface cancel out each other, so that the anti-reflection effect manifests itself. The anti-reflection refers to the phenomenon in which the wave front 100A reflected from the front surface of a first film 100 and the wave front 101B reflected from the interface between the first film 100 and a second film 101 are 180° out of phase with each other, and in which the reflected light intensity of a reflected wave front 103 is decreased, as shown in FIG. 7. For such anti-reflection effect, the thickness of the permeable film 40 is in the range of 20 to 30 nm. This further decreases the surface reflectivity of the permeable film 40 to further improve the annealing treatment speed.

Further, a high temperature of approximately 1000° C. is reached, as described above, in the step of forming the ohmic electrode in the method of manufacturing the SiC semiconductor device 1. Accordingly, the permeable film 40 is required to have heat resistance to a temperature of at least 1000° C. or higher. However, TiN used for the permeable film 40 in the present embodiment has a melting point of approximately 3000° C. to have sufficient heat resistance. Thus, no problems arise from the viewpoint of heat resistance.

In the present embodiment, the permeable film 40 is not completely removed but is left, so that there is a danger that the resistance of the whole SiC semiconductor device 1 is increased. However, the resistivity of TiN used for the permeable film 40 is as low as approximately 40 μΩcm. This minimizes the increase in the resistance of the whole SiC semiconductor device 1.

When the permeable film 40 is removed, the interdiffusion of the material used for the alloy layer 31 and the material used for the back surface electrode 20 occurs in some cases. For example, when the back surface electrode 20 is an electrode having a two-layer structure comprised of Ni and Au, there are cases in which Si is diffused from the Ni silicide layer that is the alloy layer 31 toward the back surface electrode 20. On the other hand, when a Cu electrode is used as the back surface electrode 20 from the viewpoint of meeting the requirement for high temperature, there are cases in which Cu is diffused toward the alloy layer 31. However, the permeable film 40 is provided between the alloy layer 31 and the back surface electrode 20 in the present embodiment. The permeable film 40 functions as a barrier layer to suppress the diffusion of Si and Cu.

Although TiN is used as the metal nitride film for the permeable film 40, the present invention is not limited to this. For example, ZiN (zirconium nitride) or HfN (hafnium nitride) may be used as the metal nitride film for the permeable film 40. An instance in which ZrN (zirconium nitride) or HfN (hafnium nitride) is used for the permeable film 40 will be described below.

FIG. 6B is a graph showing a relationship between the thickness d (abscissa) of the permeable film 40 made of ZrN and HfN deposited on the metal layer 30 and the surface reflectivity R (ordinate) of the permeable film 40 during the irradiation with laser light. In either case, the incident laser light has a wavelength of 355 nm. In FIG. 6B, solid squares (■) denote experimental results for a ZrN film, and open diamonds (◇) denote experimental results for a HfN film.

In FIG. 6B, it is found that, when the thickness of the ZrN film is 70 nm, the reflectivity of ZrN reaches a minimum value of 3.8%, which in turn achieves a reduction of 39.2% as compared with the reflectivity of 43% of the Ni front surface on which the permeable film is not deposited. It is also found that, when the thickness of the HfN film is 70 nm, the reflectivity of HfN is 0.6%, which in turn achieves a reduction of 42.4% as compared with the reflectivity of the Ni front surface. Thus, the use of these materials increases the amount of laser light absorbed by the metal layer 30 side to reduce the laser energy density required for the formation of the alloy layer 31 by reaction of the metal layer 30 with SiC in the SiC semiconductor substrate 11. This achieves the improvement in the treatment speed in the laser annealing treatment.

In FIG. 6B, when the thickness of the permeable film 40 is greater than 0 nm, the treatment speed in the laser annealing treatment is improved because the surface reflectivity of the peimeable film 40 is lower than that of the Ni layer itself. However, when ZrN (zirconium nitride) or HfN (hafnium nitride) is used as shown in FIG. 6B, the thickness of the permeable film 40 in particular in the range of 50 to 100 nm causes a further decrease in surface reflectivity. This further improves the treatment speed in the laser annealing treatment.

In such a case, the permeable film 40 is also eclectically conductive, which in turn eliminates the need to provide the step of removing the permeable film 40 during the formation of the back surface structure 3 of the SiC semiconductor device 1. This suppresses the increase in the number of manufacturing steps during the formation of the back surface structure 3. Also, the permeable film 40 contains no oxygen atoms. This reduces the danger that the metal layer 30 is oxidized during the laser irradiation for the formation of the alloy layer 31 to suppress the degradation of the ohmic characteristics of the alloy layer 31 with respect to the SiC semiconductor substrate 11.

Further, these materials are lower in resistance than TiN because ZrN has a resistivity of approximately 18 μΩcm and HfN has a resistivity of approximately 32 μΩcm. For this reason, when the back surface electrode 20 is formed without removing the permeable film 40 after the alloy layer 31 is formed by laser light irradiation, the permeable film 40 has a sufficiently low resistance. This suppresses the increase in the resistance of the whole SiC semiconductor device. In addition, ZrN and HfN of the permeable film 40 function as a barrier layer for preventing the diffusion of metals of different types in the same manner as Tin.

Second Embodiment

In the first embodiment of the present invention, the permeable film 40 that is a metal nitride film is provided between the alloy layer 31 and the back surface electrode 20. In such a case, however, there is a danger that reliability is decreased between the alloy layer 31 and the permeable film 40, depending on the manufacturing conditions of the semiconductor device and the like. It is therefore an object of a second embodiment to provide a SiC semiconductor device capable of improving the reliability thereof. A SiC semiconductor device 5 according to the present embodiment differs from the SiC semiconductor device 1 according to the first embodiment in including a diffusion layer 32 on the back surface side of the SiC semiconductor device. Only the difference will be described below.

Figure 8:
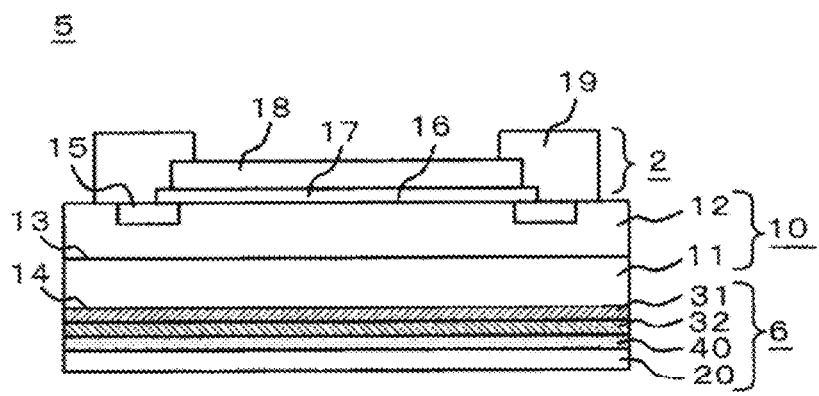
FIG. 8 is a schematic sectional view showing the silicon carbide semiconductor device according to a second embodiment of the present invention.

First, the configuration of the SiC semiconductor device 5 according to the second embodiment will be described. FIG. 8 is a schematic sectional view showing the SiC semiconductor device 5 according to the second embodiment of the present invention. An SBD is taken as an example for description, as in the first embodiment.

With reference to FIG. 8, a back surface structure 6 is provided on the second main surface 14 side (back surface) of the SiC semiconductor substrate 11. The back surface structure 6 includes the alloy layer 31, the diffusion layer 32, the permeable film 40 and the back surface electrode 20. It is desirable that the diffusion layer 32 is a film of metal exhibiting adhesion to both the metal (Ni, Ti, Mo, W, Ta and the like) forming the alloy layer 31 and the permeable film 40 (TiN, ZrN, HfN and the like). A metal film made of any one selected from the group consisting of Ti, Zr, Hf and the like may be used for the diffusion layer 32. For example, a Ti film is preferably used as the diffusion layer 32 when the alloy layer 31 is made of an alloy of Ni and SiC and the permeable film 40 is made of TiN.

Figure 9:
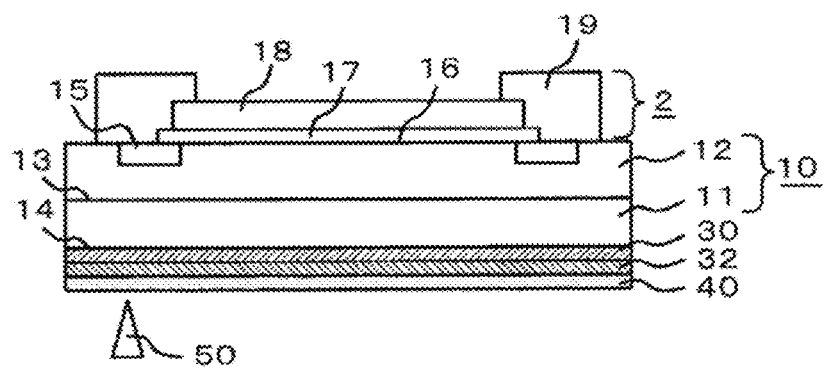
FIG. 9 is a schematic sectional view showing one step in the method of manufacturing a silicon carbide semiconductor device according to the second embodiment of the present invention.

Next, a method of manufacturing the SiC semiconductor device 5 according to the second embodiment will be described. FIG. 9 is a schematic sectional view showing the step corresponding to FIG. 2E in the method of manufacturing the SiC semiconductor device according to the first embodiment. Only a method of manufacturing the back surface structure 6 which is the difference from the first embodiment will be described hereinafter.

As described in the step of FIG. 2D in the description of the first embodiment, the second main surface 14 of the SiC semiconductor substrate 11 is mechanically ground and polished, so that the thickness of the SiC semiconductor substrate 11 is decreased. Thereafter, the back surface structure 6 is formed on the second main surface 14 of the SiC semiconductor substrate 11. First, the metal layer 30 for the formation of a silicide layer (alloy layer 31) with SiC is deposited on the second main surface 14. In the present embodiment, Ni is used for the metal layer 30. The metal layer shall have a thickness of 100 nm, for example, as in the first embodiment.

Thereafter, the diffusion layer 32 is deposited on the metal layer 30. In the present embodiment, Ti is used for the diffusion layer 32. It is desirable that the thickness of the diffusion layer 32 is greater than 10 nm, and shall be 50 nm, for example. The permeable film 40 is deposited on the diffusion layer 32. The permeable film 40 is a metal nitride film, and shall be a TiN film in the present embodiment. It is desirable that the thickness of the permeable film 40 is not greater than 500 nm as in the first embodiment, and shall be 50 nm, for example. Thereafter, as shown in FIG. 9, an annealing treatment which directs the laser light 50 through the permeable film 40 is performed to cause metal (Ni) in the metal layer 30 and SiC in the SiC semiconductor substrate 11 to react with each other, thereby forming the alloy layer 31. Thereafter, the back surface electrode 20 is formed on the permeable film 40.

Figure 10:
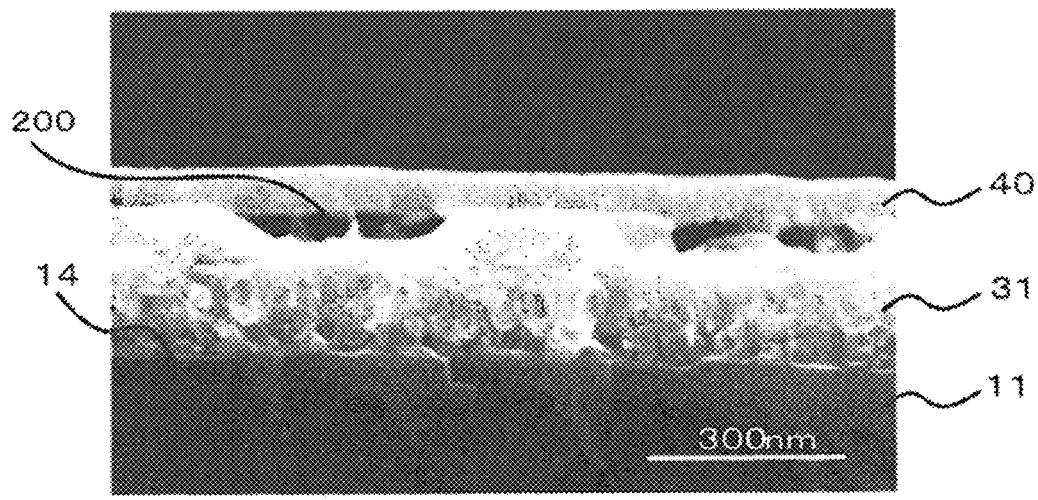
FIG. 10 shows a sectional SEM (Secondary Electron Microscope) image of the silicon carbide semiconductor device according to the first embodiment of the present invention.

The effects produced by the aforementioned configuration according to the second embodiment of the present invention will be described. FIG. 10 shows a sectional SEM image of the back surface structure obtained when the annealing treatment using the laser light 50 is performed through the permeable film 40 without providing the diffusion layer 32. The alloy layer 31 shown in FIG. 10 is a silicide layer comprised of Ni and SiC, and the permeable film 40 is made of TiN. It is found from FIG. 10 that voids are created between the suicide layer (alloy layer 31) and the TiN (permeable film 40). This results from the fact that Ni and SiC rapidly react with each other during the annealing using the laser light 50 to form a suicide layer but Ni and TiN react little with each other as compared with the silicidation reaction. Specifically, the rate of reaction between the metal layer 30 (Ni) and the SiC semiconductor substrate 11 (SiC) is very higher than the rate of reaction between the metal layer 30 (Ni) and the permeable film 40 (TiN). The difference in reaction rate between the layers lying over and under the metal layer 30 creates the voids between the alloy layer 31 and the permeable film 40 where the reaction rate is lower. The voids are not problematic if there are not so many regions in which the voids are created. However, there is apprehension that the number of voids created at the interface is increased, depending on the manufacturing conditions such as irradiation time for the laser annealing, to give rise to a decrease in adhesion of the TiN film, resulting in the problem of removal of the film.

In the present embodiment, the diffusion layer 32 is provided between the alloy layer 31 and the permeable film 40 for the purpose of suppressing the creation of the aforementioned voids to improve the reliability of the SiC semiconductor device. FIG. 11 shows a sectional SEM image of the SiC semiconductor device 5 according to the present embodiment.

FIG. 11 shows a sectional SEM image of a sample produced by depositing Ni with a thickness of 100 nm on the second main surface 14 of the SiC semiconductor substrate 11, depositing Ti with a thickness of 50 nm thereon, depositing TiN with a thickness of 50 nm thereon, and then directing the laser light 50 thereonto. It is found that the voids appearing in FIG. 10 are not created in FIG. 11. The creation of voids is verified after the sample is irradiated with the laser light 50 while the thickness of the Ti layer provided as the diffusion layer 32 is varied. As a result of the verification, it is found that the suppression of the void creation becomes pronounced as the thickness of the diffusion layer 32 increases and that no voids are created in particular when the thickness of the diffusion layer 32 is greater than 50 nm. Although no contrast clue to Ti of the diffusion layer 32 is seen in FIG. 11, the diffusion layer 32 may be left after the annealing using the laser light 50.

As mentioned above, the void creation is suppressed by providing the diffusion layer 32 for the following reason. When Ni (metal layer 30) reacts with SiC to form the suicide layer (alloy layer 31) during the annealing using the laser light 50, the rate of reaction between Ti and Ni is higher than the rate of reaction between TiN and Ni. This reduces the difference in reaction rate between the layers lying over and under the metal layer 30 to suppress the creation of the voids.

Although Ti is used for the diffusion layer 32 and TiN is used for the permeable film 40 as mentioned above in the present embodiment, other materials may be used. However, the use of Ti for the diffusion layer 32 and TiN for the permeable film 40 as mentioned above allows the same deposition target to be used for the deposition of both the diffusion layer 32 and the permeable film 40, thereby eliminating the need for the increase M the number of steps and the enhancement of facilities. Also, when the permeable film 40 is made of ZrN and HfN for example, the use of Zr and Hf, respectively, for the diffusion layer 32 allows the same deposition target to be used for the deposition of both the diffusion layer 32 and the permeable film 40.

The embodiments according to the present invention may be arbitrarily combined, modified and omitted, as appropriate, within the scope of the present invention.

REFERENCE SIGNS LIST

1 SiC semiconductor device; 2 Front surface structure; 3 Back surface structure; 5 SiC semiconductor device; 6 Back surface structure; 10 SiC semiconductor base body; 11 SiC semiconductor substrate; 12 Drift layer: 13 First main surface; 14 Second main surface; 15 Ion implanted region; 16 Schottky region; 17 Schottky electrode; 18 Interconnect electrode; 19 Protective film; 20 Back surface electrode; 30 Metal layer; 31 Alloy layer; 32 Diffusion layer; 40 Permeable film; 50 Laser light; 100 First film; 100A Wave front; 101 Second film; 101B Wave front; 103 Reflected wave front 200 Voids.

The invention claimed is:

1. A method of manufacturing a silicon carbide semiconductor device, the method comprising:
  forming a metal layer made of a first metal on a semiconductor substrate made of silicon carbide;
  forming a metal nitride film obtained by nitriding a second metal on the metal layer;
  directing a laser light through the metal nitride film to form a layer of an alloy of silicon carbide in the semiconductor substrate and the first metal in the metal layer; and
  forming an electrode on the metal nitride film,
  wherein a surface reflectivity of the metal nitride film when the laser light is directed is lower than a surface reflectivity when the laser light is directed in the absence of a film on the metal layer.

2. The method according to claim 1, wherein
  the metal nitride film is made of titanium nitride.

3. The method according to claim 1, wherein
  the semiconductor substrate is made of n type silicon carbide, and
  the first metal is nickel.

4. The method according to claim 1, wherein
  the metal nitride film has a thickness of not greater than 500 nm.

5. The method according to claim 1, wherein
  the laser light has a wavelength of 355 nm or 532 nm, and
  the metal nitride film has a thickness of not greater than 500 nm.

6. A method of manufacturing a silicon carbide semiconductor device, the method comprising:

forming a metal layer made of a first metal on a semiconductor substrate made of silicon carbide;
forming a diffusion layer made of a second metal on the metal layer;
forming a metal nitride film obtained by nitriding a third metal on the second metal;
directing laser light through the metal nitride film to form a layer of an alloy of silicon carbide in the semiconductor substrate and the first metal in the metal layer; and
forming an electrode on the metal nitride film.

7. The method according to claim 6, wherein
the second metal is the same metal as the third metal.

8. The method according to claim 6, wherein
the metal nitride film is made of titanium nitride.

9. The method according to claim 6, wherein
the semiconductor substrate is made of n type silicon carbide, and
the first metal is nickel.

10. The method according to claim 6, wherein
the metal nitride film has a thickness of not greater than 500 nm.

11. The method according to claim 10, wherein
the metal nitride film has a thickness of 20 o 30 nm.

12. A silicon carbide semiconductor device, comprising:
a semiconductor substrate made of silicon carbide;
an alloy layer provided on the semiconductor substrate and made of an alloy of silicon carbide and a first metal;
a diffusion layer provided on the alloy layer and made of a second metal;
a metal nitride film provided on the diffusion layer and made of a nitride of a third metal; and
an electrode provided on the metal nitride film.

13. The silicon carbide semiconductor device according to claim 12, wherein the second metal is the same metal as the third metal.

14. The silicon carbide semiconductor device according to claim 13, wherein the metal nitride film is made of titanium nitride.

15. The silicon carbide semiconductor device according to claim 12, wherein a surface reflectivity of the metal nitride film for light having a wavelength of 355 nm or 532 nm is lower than that of the metal layer for light having a wavelength of 355 nm or 532 nm.

16. The silicon carbide semiconductor device according to claim 12, wherein
the semiconductor substrate is made of n type silicon carbide, and
the first metal is nickel.

17. The silicon carbide semiconductor device according to claim 12, wherein the metal nitride film has a thickness of not greater than 500 nm.

18. The silicon carbide semiconductor device according to claim 17, wherein the metal nitride film has a thickness in the range of 20 to 30 nm.

* * * * *